(12) United States Patent
Maniscalco et al.

(10) Patent No.: US 11,380,641 B2
(45) Date of Patent: Jul. 5, 2022

(54) PILLAR BUMP WITH NOBLE METAL SEED LAYER FOR ADVANCED HETEROGENEOUS INTEGRATION

(71) Applicant: International Business Machines Corporation, Armonk, NY (US)

(72) Inventors: Joseph F. Maniscalco, Lake Katrine, NY (US); Kenneth Chun Kuen Cheng, Shatin (HK); Koichi Motoyama, Clifton Park, NY (US); Oscar van der Straten, Guilderland Center, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/089,199

(22) Filed: Nov. 4, 2020

(65) Prior Publication Data
US 2022/0139858 A1    May 5, 2022

(51) Int. Cl.
*H01L 23/00*    (2006.01)

(52) U.S. Cl.
CPC .............. *H01L 24/11* (2013.01); *H01L 24/13* (2013.01); *H01L 2224/114* (2013.01); *H01L 2224/1147* (2013.01); *H01L 2224/11614* (2013.01); *H01L 2924/01029* (2013.01); *H01L 2924/01044* (2013.01); *H01L 2924/01045* (2013.01); *H01L 2924/01046* (2013.01); *H01L 2924/01077* (2013.01); *H01L 2924/01078* (2013.01)

(58) Field of Classification Search
CPC combination set(s) only.
See application file for complete search history.

(56) References Cited

U.S. PATENT DOCUMENTS

| | | | |
|---|---|---|---|
| 4,087,314 A | 5/1978 | George | |
| 7,183,648 B2 | 2/2007 | Ramanathan | |
| 8,232,193 B2 | 7/2012 | Chang | |
| 8,441,124 B2 | 5/2013 | Wu | |

(Continued)

FOREIGN PATENT DOCUMENTS

| | | |
|---|---|---|
| CN | 103489804 A | 1/2014 |
| CN | 105355574 A | 2/2016 |
| CN | 210040131 U | 2/2020 |

OTHER PUBLICATIONS

Siow, et al., "Fine pitch Cu pillar wafer process development and seed layer etching characterization", 14th Electronics Packaging Technology Conference, 2012, pp. 755-758.

(Continued)

*Primary Examiner* — Douglas W Owens
(74) *Attorney, Agent, or Firm* — Michael A. Petrocelli (57) ABSTRACT

A pillar bump structure, and a method for forming the same includes forming, on a semiconductor substrate, a blanket liner followed by a seed layer including a noble metal. A first photoresist layer is formed directly above the seed layer followed by the formation of a first plurality of openings within the photoresist layer. A first conductive material is deposited within each of the first plurality of openings to form first pillar bumps. The first photoresist layer is removed from the semiconductor structure followed by removal of portions of the seed layer extending outward from the first pillar bumps, a portion of the seed layer remains underneath the first pillar bumps.

12 Claims, 8 Drawing Sheets

(56) References Cited

U.S. PATENT DOCUMENTS

| | | | |
|---|---|---|---|
| 8,803,333 B2 | 8/2014 | Yu | |
| 9,331,040 B2 | 5/2016 | Beck | |
| 9,875,980 B2 | 1/2018 | Rinne | |
| 10,236,268 B1 | 3/2019 | Dhandapani | |
| 2011/0266667 A1 | 11/2011 | Wu | |
| 2012/0007231 A1* | 1/2012 | Chang | H01L 24/11 257/737 |
| 2012/0061823 A1* | 3/2012 | Wu | H01L 23/3157 257/737 |
| 2012/0091576 A1* | 4/2012 | Tsai | H01L 24/03 257/737 |
| 2012/0326297 A1* | 12/2012 | Choi | H01L 24/05 257/737 |
| 2018/0061804 A1* | 3/2018 | Yang | H01L 24/13 |
| 2019/0131260 A1* | 5/2019 | Kirby | H01L 24/13 |

OTHER PUBLICATIONS

International Search Report and Written Opinion, International Application No. PCT/CN2021/126607, dated Feb. 9, 2022, 9 pages.
Maniscalco, et al., "Pillar Bump With Noble Metal Seed Layer for Advanced Heterogeneous Integration", International Application No. PCT/CN2021/126607, International Filing Date Oct. 27, 2021, 26 pages.

* cited by examiner

PILLAR BUMP WITH NOBLE METAL SEED LAYER FOR ADVANCED HETEROGENEOUS INTEGRATION

BACKGROUND

The present invention generally relates to the field of complementary metal-oxide semiconductor (CMOS) devices, and more particularly to fabricating pillar bumps with a noble metal seed layer to prevent copper loss and copper undercut during advanced heterogenous integration.

Copper pillar bump technology is a chip-to package interconnect technology common in current advanced integration schemes that offers superior electromigration (EM) performance compared to conventional controlled collapse chip connection (C4) solders.

In traditional flip-chip packaging, solder bump connections are used to establish electrical contact between a chip's I/O pads and the substrate or lead frame of the package. In copper pillar technology, instead of using a solder bump, the electronic components are connected to the substrate by means of a copper pillar bump (also referred to as column, pillar solder bump, or solder column connection). Copper pillar technology allows achieving a finer pitch with minimum probability of bump bridging, reducing the capacitance load for the circuits, and allowing the electronic components to perform at higher frequencies.

Copper pillar bumps may also include copper alloys and other copper containing conductors, or the pillar bumps may be formed of other conductive materials. An advantage of pillar bumps is that the pillars do not completely deform during reflow. While solder caps form a spherical tip that does melt during thermal reflow, the columnar copper pillars tend to maintain their shape.

Additionally, copper pillars are thermally more conductive than previously used solder bumps which enhances heat transfer. The narrow copper pillars can be used in finer pitch arrays than previously possible with traditional solder bumps, without bridging shorts, and other problems such as non-uniform bump height. However, certain etching processes utilized during advanced packaging schemes including 3D heterogenous integration can negatively impact the integrity of copper pillar bumps.

SUMMARY

Advanced packaging schemes with copper (Cu) pillar bumps or copper pedestal for either Cu—Cu bonding or Cu with solder bonding utilize a wet copper seed etching process. Wet etching of the copper seed layer causes adverse side effects such as loss of copper from the expose copper pillar and copper undercut of the pedestal. Therefore, there is a need for alternative designs and techniques for forming copper pillar bumps that can eliminate copper loss and pedestal undercut during wet etching processes.

Shortcomings of the prior art are overcome and additional advantages are provided through the provision of a method for forming a semiconductor structure that includes forming, on a semiconductor substrate, a blanket liner followed by a seed layer comprising a noble metal, forming a first photoresist layer directly above the seed layer, forming a first plurality of openings within the photoresist layer, depositing a first conductive material within each of the first plurality of openings to form first pillar bumps, removing the first photoresist layer from the semiconductor structure, and removing portions of the seed layer extending outward from the first pillar bumps. A portion of the seed layer remains underneath the first pillar bumps.

Another embodiment of the present disclosure provides a semiconductor structure that includes a pillar bump above a semiconductor substrate, the pillar bump including a conductive material, and a seed layer below the pillar bump and above the semiconductor substrate, the seed layer comprising a noble metal. A width of the seed layer is equal to a width of the pillar bump.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Copper (Cu) pillar bumps, or simply Cu pillars, offer a number of advantages for advanced flip chip packaging compared to conventional solder bumps. The transition to Cu pillars has been driven by the limitations related to size and pitch (i.e., space between features) of traditional controlled collapse chip connection (C4) bumping. As pitch requirements continue to shrink, Cu pillars can enable higher-density designs while maintaining sufficient bump height.

However, wet etching of the copper seed layer typically performed in advanced packaging schemes for either Cu—Cu bonding or Cu with solder bonding can negatively impact the integrity of Cu pillars causing problems such as loss of copper from the exposed Cu pillar and copper undercut at the base of the Cu pillar or pedestal. Therefore, there is a need for alternative designs and techniques for forming Cu pillar bumps that can eliminate copper loss and pedestal undercut during wet etching processes.

Therefore, embodiments of the present disclosure provide a method and associated structure for fabricating pillar bump structures using a seed layer composed of a noble metal that allows the use of a directional plasma dry etch process that is selective only to the noble metal seed layer. This can prevent loss of copper on top surfaces and along sidewalls of the copper pillars as well as preventing pedestal undercut. Another embodiment of the present disclosure provides a method and associated structure for fabricating pillar bump structures using the noble metal seed layer together with a conformal protective layer formed along sidewalls of the pillar bumps to further preserve a structural integrity of the pillars during subsequent etching processes.

An embodiment by which pillar bump structures can be formed using the noble metal seed layer for preventing copper loss and pedestal undercut is described in detailed below by referring to the accompanying drawings in FIGS. 1-6. An alternate embodiment by which the pillar bump structures can be formed to prevent copper loss and pedestal undercut is described in detailed below by referring to the accompanying drawings in FIGS. 7-15.

Figure 1:
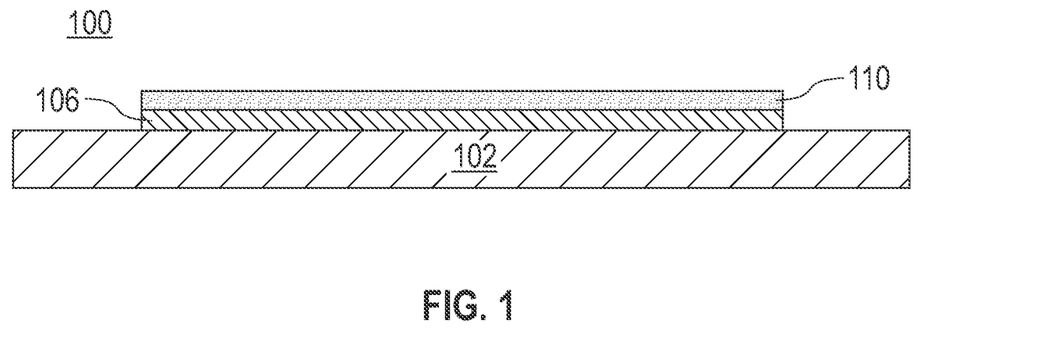
FIG. 1 is a cross-sectional view of a simplified semiconductor structure at an intermediate step during a semiconductor manufacturing process, according to an embodiment of the present disclosure.

Referring now to FIG. 1, a cross-sectional view of a simplistically depicted semiconductor structure 100 is shown at an intermediate step during a semiconductor manufacturing process, according to an embodiment of the present disclosure.

At this step of the manufacturing process, the semiconductor structure 100 may include a semiconductor substrate 102, a blanket liner 106 and a seed layer 110. For ease of illustration, the embodiment of FIG. 1 depicts a simplified version of the semiconductor substrate 102.

As known by those skilled in the art, the semiconductor substrate 102 can be used for bump fabrication during semiconductor integrated circuit fabrication, and integrated circuits may be formed therein and/or thereupon. The semiconductor substrate 102 may include, but is not limited to, a bulk silicon substrate, a semiconductor wafer, a silicon-on-insulator (SOI) substrate, or a silicon germanium substrate. Other semiconductor materials including group III, group IV, and group V elements may also be used. The semiconductor substrate 102 may further include a plurality of isolation features (not shown), such as shallow trench isolation (STI) features or local oxidation of silicon (LOCOS) features. The isolation features may define and isolate various microelectronic elements (not shown).

Examples of the various microelectronic elements that may be formed in the semiconductor substrate 102 may include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, capacitors, inductors, fuses, or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The semiconductor substrate 102 may further include inter-layer dielectric layers (not shown) and a metallization structure (not shown) overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines (not shown) in the metallization structure may include copper or copper alloys. A person skilled in the art may understand the formation details of the metallization structure.

The blanket liner 106 formed above the semiconductor substrate 102 may act as an adhesion layer to the semiconductor substrate 102, as well as a barrier layer to prevent copper from diffusing to device regions of the semiconductor substrate 102. Standard deposition processes can be used to form the blanket liner 106. For example, in some embodiments, the blanket liner 106 can be formed via chemical vapor deposition (CVD), physical vapor deposition (PVD), or atomic layer deposition (ALD). Exemplary materials that can be used to form the blanket liner 106 may include titanium, titanium nitride, tantalum, tantalum nitride, and combinations thereof. According to an embodiment, the blanket liner 106 may have a thickness varying from approximately 50 nm to approximately 500 nm and ranges there between, although a thickness less than 50 nm and greater than 500 nm may be acceptable.

In some embodiments, a passivation layer (not shown) including any suitable dielectric material may be deposited over the semiconductor substrate 102 prior to forming the blanket liner 106.

With continued reference to FIG. 1, the seed layer 110 is formed above the blanket liner 106 using known deposition processes. For example, the seed layer 110 can be formed using a sputtering technique, among other known metal deposition techniques. According to an embodiment, the seed layer 110 is made of a noble metal including, but not limited to, ruthenium (Ru), rhodium (Rh), iridium (Ir), platinum (Pt) and palladium (Pd). The seed layer 110 may have a thickness varying from approximately 20 nm to approximately 500 nm and ranges there between, although a thickness less than 20 nm and greater than 500 nm may be acceptable.

Together the blanket liner 106 and the seed layer 110 form an under bump metallization (UBM) layer. It should be noted that the use of a noble metal to form the seed layer 110 enables the use of a plasma dry etch process during subsequent manufacturing steps instead of the traditional wet chemical etching. As will be explained in detail below, the dry etch process is selective only to the seed layer 110 which can prevent damage to the copper pillars during the manufacturing process.

Figure 2:
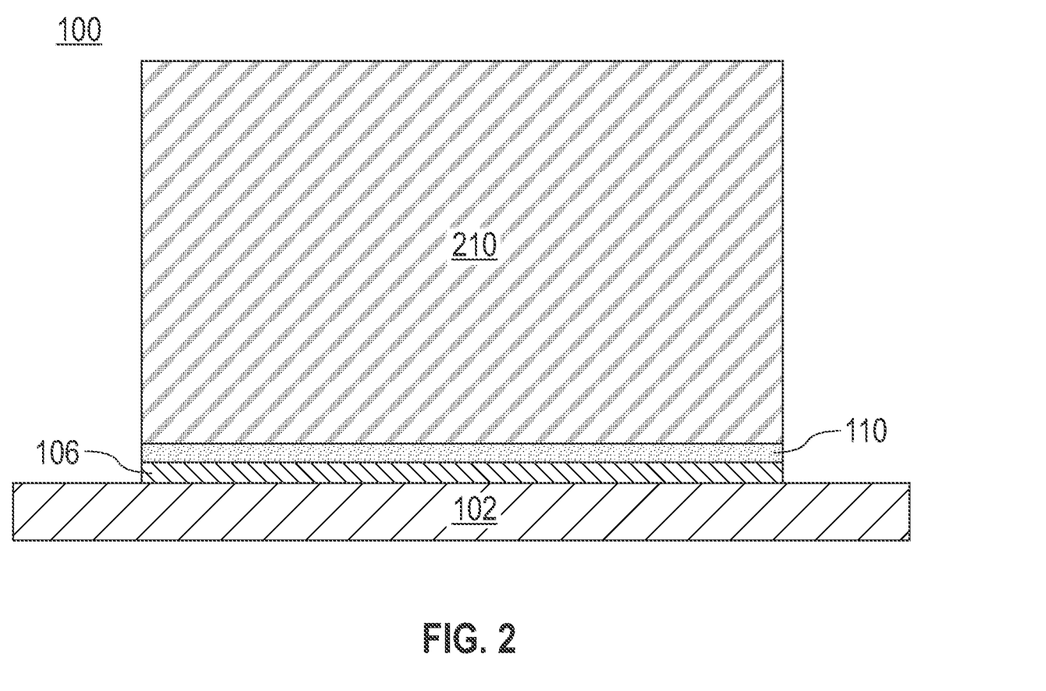
FIG. 2 is a cross-sectional view of the simplified semiconductor structure after depositing a photoresist layer, according to an embodiment of the present disclosure.

Referring now to FIG. 2, a cross-sectional view of the semiconductor structure 100 is shown after depositing a photoresist layer 210, according to an embodiment of the present disclosure.

The photoresist layer 210 includes a photoresist material deposited above the seed layer 110 using conventional deposition techniques such as, for example, dry film lamination or spin on liquid resist. The photoresist layer 210 may have a (vertical) thickness varying from approximately 10 um to approximately 150 um and ranges there between, although a thickness less than 10 um and greater than 150 um may be acceptable.

Figure 3:
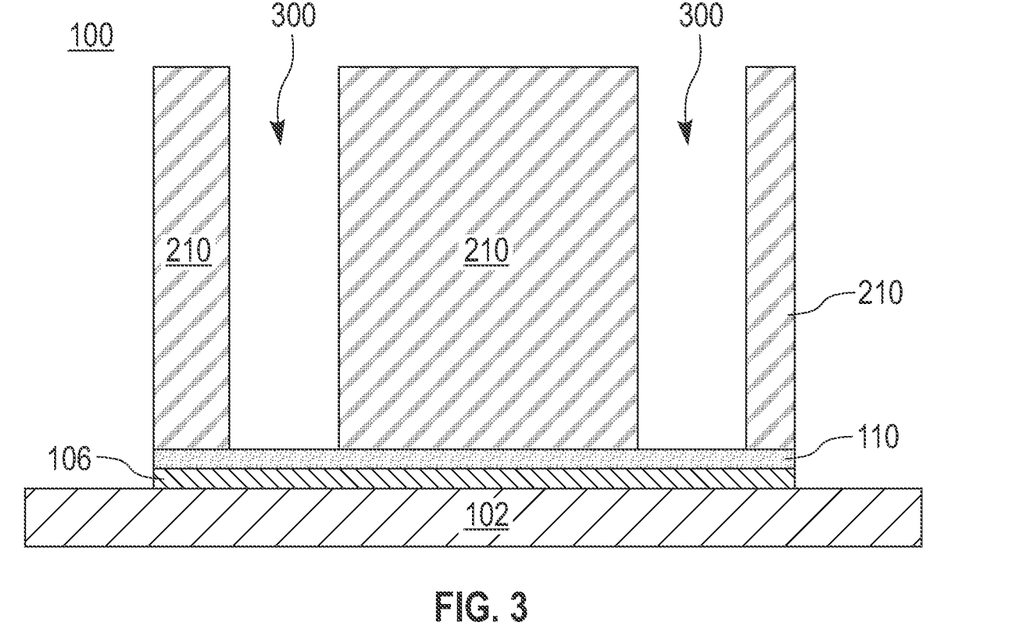
FIG. 3 is a cross-sectional view of the simplified semiconductor structure depicting the formation of a plurality of openings, according to an embodiment of the present disclosure.

Referring now to FIG. 3, a cross-section view of the semiconductor structure 100 depicting the formation of openings 300 is shown, according to an embodiment of the present disclosure. At this step of the manufacturing process, the photoresist layer 210 is subjected to conventional lithographic and etching processes to form the openings 300.

As illustrated in the figure, the openings 300 exposed an upper surface of the seed layer 110. As known by those skilled in the art, any number of openings 300 can be formed depending on circuit design and/or requirements.

Figure 4:
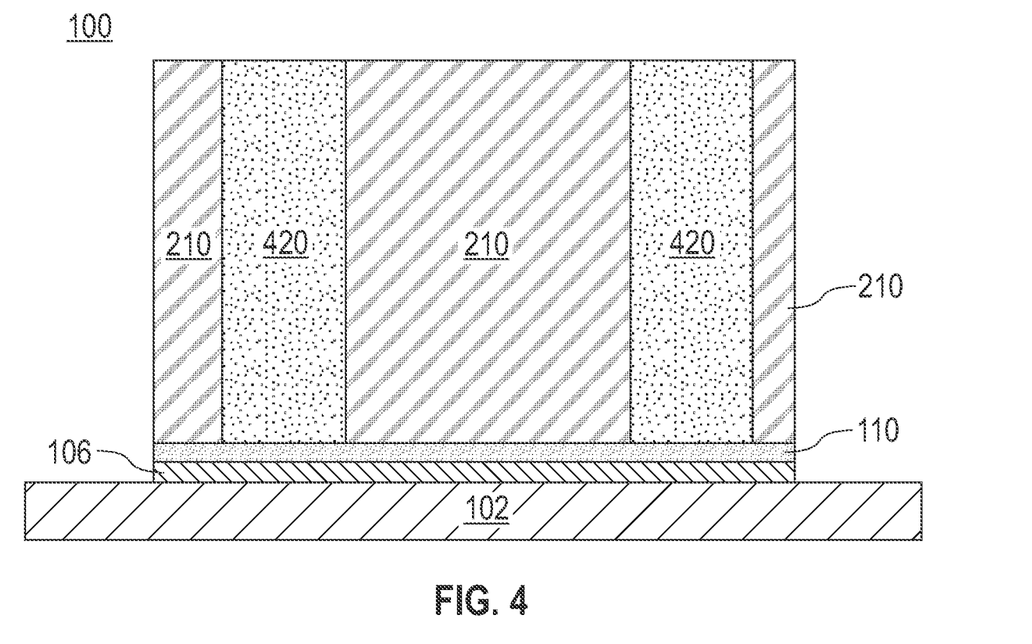
FIG. 4 is a cross-sectional view of the simplified semiconductor structure after filling the plurality of openings, according to an embodiment of the present disclosure.

Referring now to FIG. 4, a cross-sectional view of the semiconductor structure 100 after filling the openings 300 is shown, according to an embodiment of the present disclosure.

In this embodiment, the openings 300 are partially or fully filled with a conductive material with solder wettability that form the pillar bumps 420. Preferably, the conductive material includes copper (Cu) or a copper alloy such as CuAl, CuSn, or CuIn. The conductive material forming the pillar bumps 420 is deposited within the openings 300 above and in direct contact with the underlying seed layer 110. Exemplary methods of forming the conductive material may include sputtering, printing, electro plating, electroless plating, and CVD methods. According to an embodiment, the conductive material can be formed by electro-chemical plating to form the pillar bumps 420.

In an embodiment, a height of the pillar bumps 420 may vary from approximately [10] um to approximately 150 um and ranges there between, although a height less than 10 um and greater than 150 um may be acceptable. Similarly, a width of the pillar bumps 420 may vary from approximately 10 um to approximately 100 um and ranges there between, although a width less than 10 um and greater than 100 um may be acceptable. It should be noted that although the pillar bumps 420 are depicted using cross-sectional views, the pillar bumps 420 are annular in shape.

Figure 5:
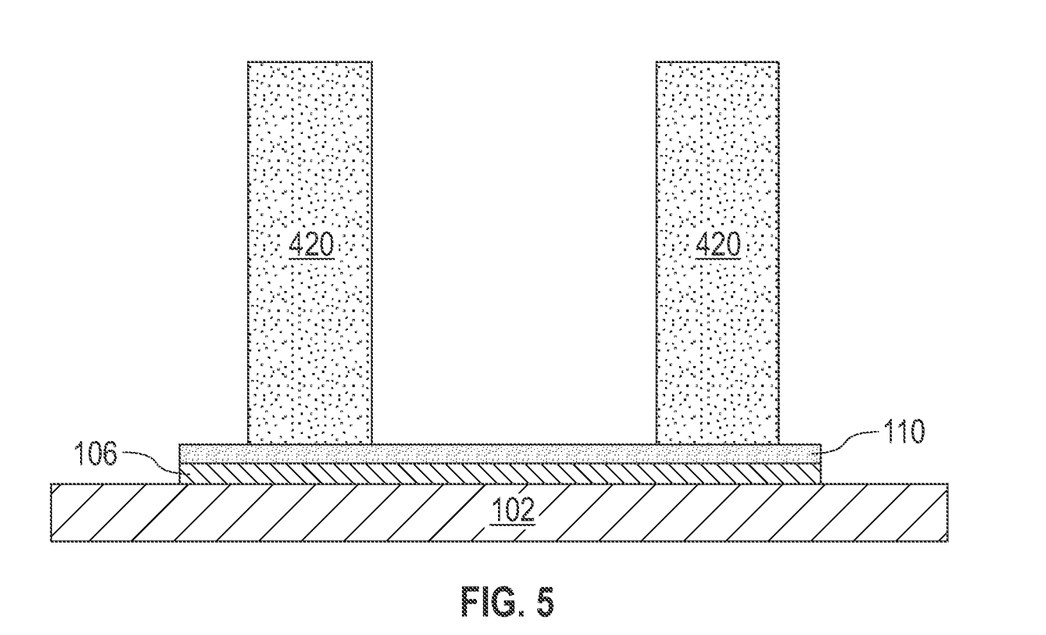
FIG. 5 is a cross-sectional view of the simplified semiconductor structure after removing the photoresist layer, according to an embodiment of the present disclosure.

Referring now to FIG. 5, a cross-sectional view of the semiconductor structure 100 after removing the photoresist layer 210 is shown, according to an embodiment of the present disclosure. The photoresist layer 210 can be removed using any known stripping process. For example, the photoresist layer 210 can be stripped using TMAH with a high pH content, with glycol to assist in swelling and NMP to aid in dissolution. Alternatively, the photoresist can be stripped using sodium or potassium hydroxide as well as DMSO solutions.

Removal of the photoresist layer 210 exposes the pillar bumps 420 and uncovered portions of the seed layer 110, as depicted in the figure.

Figure 6:
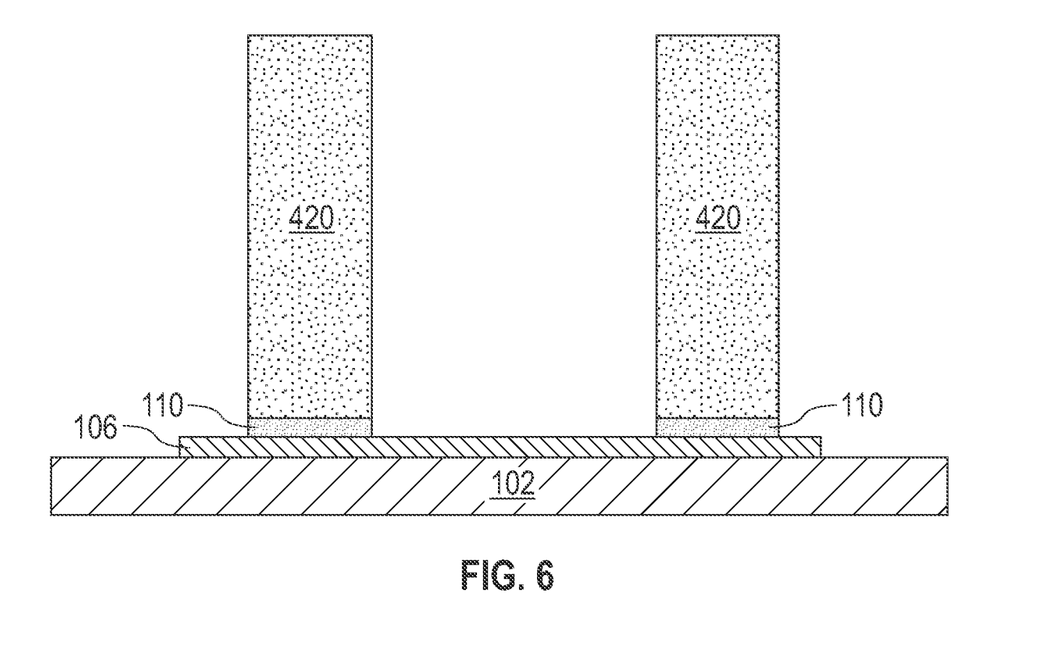
FIG. 6 is a cross-sectional view of the simplified semiconductor structure after removing uncovered portions of a seed layer, according to an embodiment of the present disclosure.

Referring now to FIG. 6, a cross-sectional view of the semiconductor structure 100 is shown after removal of uncovered portions of the seed layer 110, according to an embodiment of the present disclosure. During this step of the manufacturing process, the portion of the seed layer 110 not covered by the pillar bumps 420 can be removed by any suitable directional etching process. For example, uncovered portions of the seed layer 110 can be removed by using a reactive ion etching (RIE) technique. Specifically, portions of the seed layer 110 extending outward from the pillar bumps 420 are removed and portions of the seed layer 110 underneath the pillar bumps 420 remain in the semiconductor structure 100. A width of the remaining portions of the pillar bumps 420 below the pillar bumps 420 is substantially equal to a width of the pillar bumps 420, as depicted in the figure.

It should be noted that by using a noble metal to form the seed layer 110, a dry etching technique can be used to remove the portions of the seed layer 110 not covered by the pillar bumps 420. The dry etching technique is selective only to the noble metal seed layer 110, thereby allowing the removal of the uncovered portions of the metal seed layer 110 without undercut of the pillar bumps 420 or loss of conductive material (i.e., copper). From this step forward the manufacturing process continue following traditional processing steps.

Figure 9:
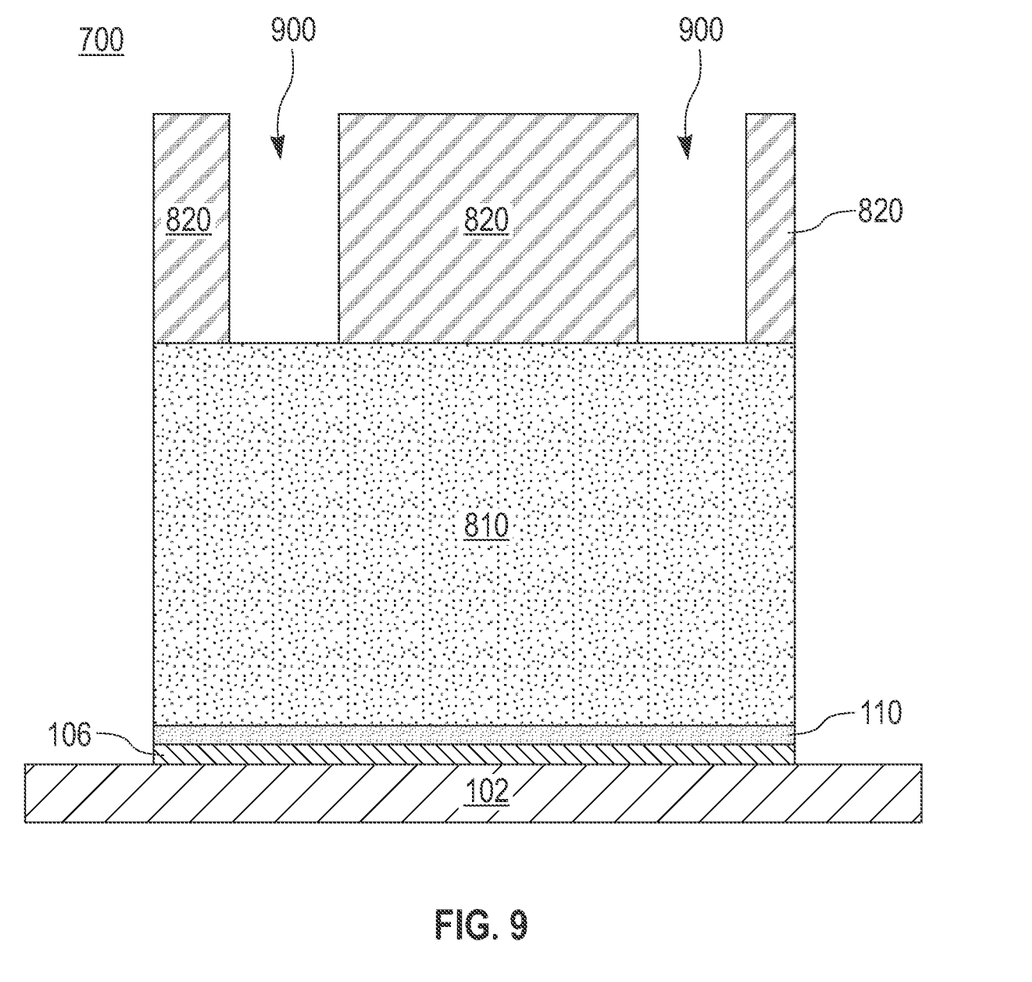
FIG. 9 is a cross-sectional view of the simplified semiconductor structure depicting the formation of a plurality of openings, according to another embodiment of the present disclosure.
Figure 10:
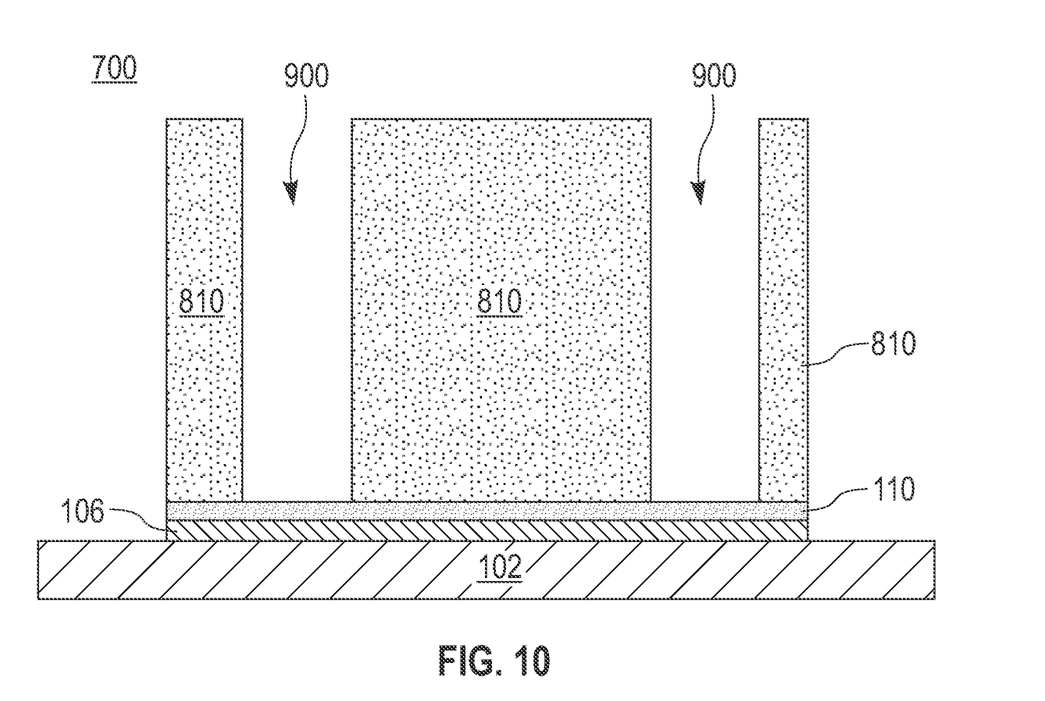
FIG. 10 is a cross-sectional view of the simplified semiconductor structure depicting extending the plurality of openings and removing the photoresist layer, according to another embodiment of the present disclosure.
Figure 11:
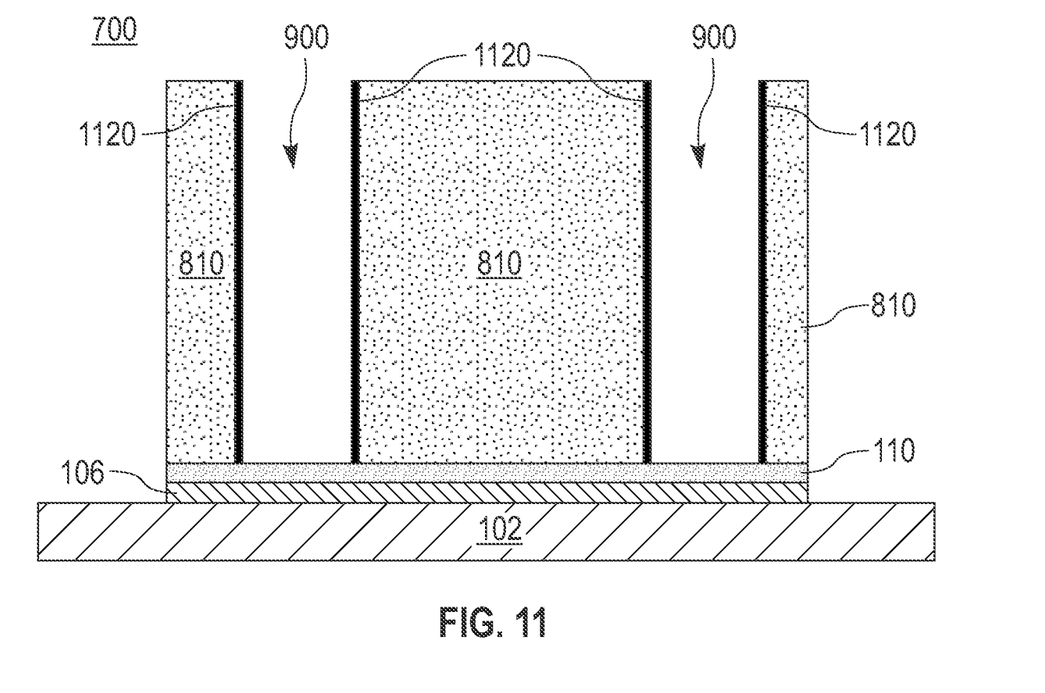
FIG. 11 is a cross-sectional view of the simplified semiconductor structure depicting the formation of a protective layer, according to another embodiment of the present disclosure.

Referring now to FIGS. 7-15, cross-sectional views of the semiconductor structure 100 illustrating an alternate processing sequence for forming pillar bumps are shown, according to another embodiment of the present disclosure. Pillar bumps 1240 (FIG. 12) are formed similarly to the pillar bumps 420 described above with reference to FIGS. 1-6. However, in this embodiment, a protective layer 1120 is formed before depositing the conductive material forming the pillar bumps 1240, as depicted in FIG. 11.

Figure 7:
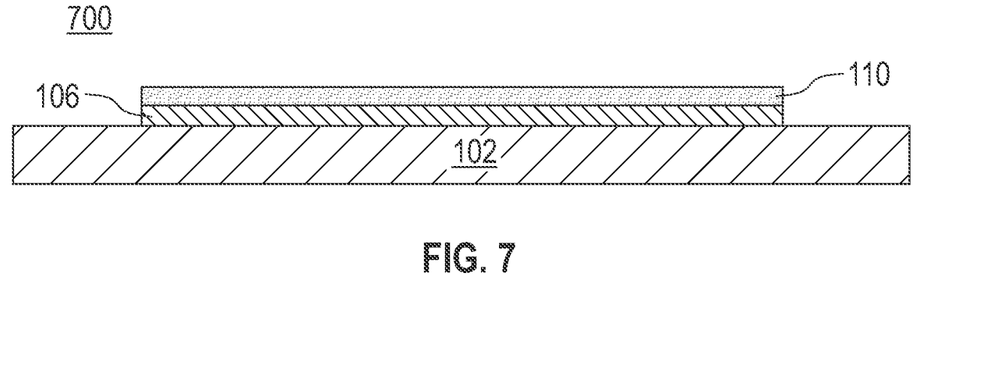
FIG. 7 is a cross-sectional view of the simplified semiconductor structure depicting a simplified semiconductor structure at an intermediate step during a semiconductor manufacturing process, according to another embodiment of the present disclosure.

Referring now to FIG. 7, a cross-sectional view of a semiconductor structure 700 similar to the semiconductor structure 100 is shown at an intermediate step during a semiconductor manufacturing process, according to an embodiment of the present disclosure. At this step, the semiconductor structure 700 includes substantially the same elements as the semiconductor structure 100 depicted in FIG. 1. Specifically, the semiconductor structure 700 includes the semiconductor substrate 102, the blanket liner 106 and the seed layer 110. The process of forming these elements was described in detail above with reference to FIG. 1.

Figure 8:
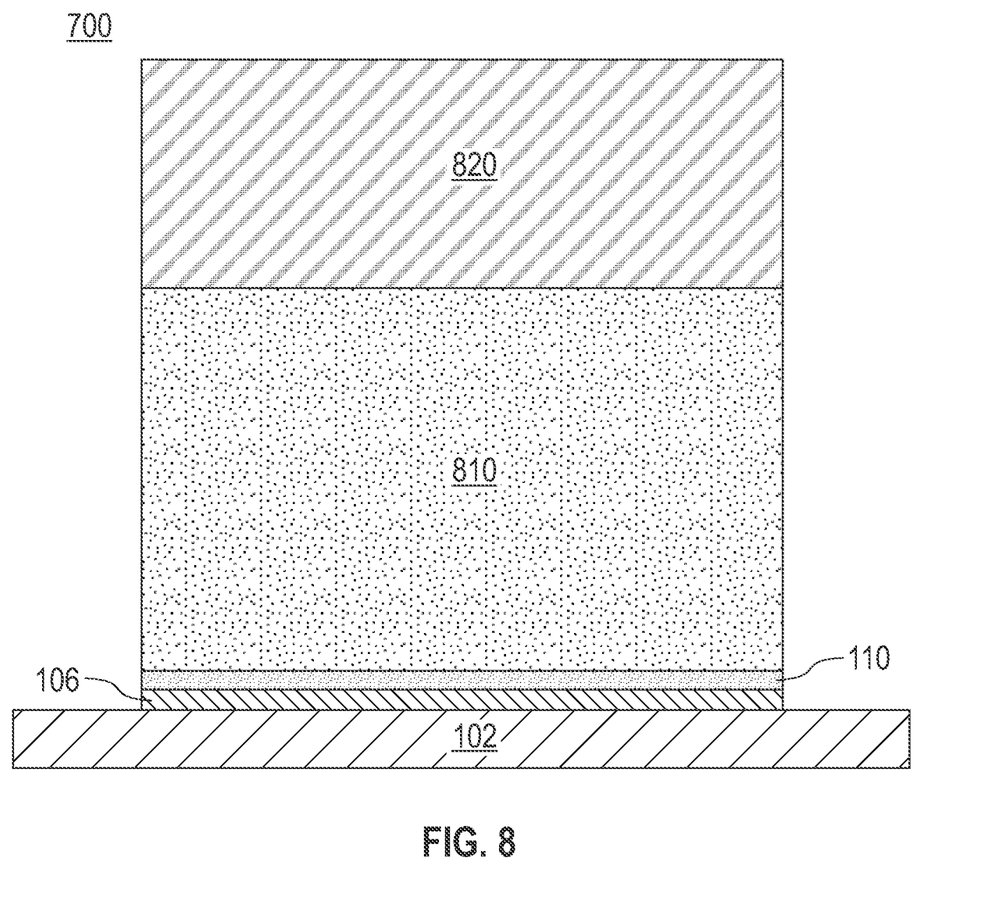
FIG. 8 is a cross-sectional view of the simplified semiconductor structure after deposition of a hardmask layer followed by deposition of a photoresist layer, according to an embodiment of the present disclosure.

Referring now to FIG. 8, a cross-sectional view of the semiconductor structure 700 is shown after deposition of a hardmask layer 810 followed by deposition of a photoresist layer 820, according to an embodiment of the present disclosure.

The hardmask layer 810 is formed directly above the seed layer 110 using known deposition techniques. The hardmask layer 810 allows the formation of a protective layer 1120, as will be described in detail below with reference to FIG. 11. Exemplary materials to form the hardmask layer 810 can include titanium nitride (TiN), silane or tetra-ethyl-orthosilane (TEOS), silicon nitride (SiN), silicon oxide, an oxide/nitride stack, or similar materials and configurations. The hardmask layer 810 may have a (vertical) thickness varying from approximately 10 um to approximately 150 um and ranges there between, although a thickness less than 10 um and greater than 150 um may be acceptable.

The photoresist layer 820 is formed above and in direct contact with the hardmask layer 810. The photoresist layer 820 is formed using similar materials and methods as the photoresist layer 210 described above with reference to FIG. 2.

Referring now to FIG. 9, a cross-sectional view of the semiconductor structure 700 depicting the formation of openings 900 is shown, according to an embodiment of the present disclosure. At this step of the manufacturing process, the photoresist layer 820 is subjected to conventional lithographic and etching processes to form the openings 900. As illustrated in the figure, the openings 900 exposed an upper surface of the hardmask layer 810 in which the openings 900 will extend as shown in FIG. 10. As known by those skilled in the art, any number of openings 900 can be formed depending on circuit design and/or requirements.

Referring now to FIG. 10, a cross-sectional view of the semiconductor structure 700 is shown after extending the openings 900 and removing the photoresist layer 820, according to an embodiment of the present disclosure. In this embodiment, traditional patterning techniques can be implemented to extend the openings 900 into the hardmask layer 810. The extended openings 900 exposed upper surfaces of the seed layer 110, as illustrated in the figure.

Similar to the photoresist layer 210 (FIG. 2), the photoresist layer 820 can be removed using any known stripping process. For example, the photoresist layer 820 can be stripped using TMAH with a high pH content, with glycol to assist in swelling and NMP to aid in dissolution. Alternatively, the photoresist can be stripped using sodium or potassium hydroxide as well as DMSO solutions.

Referring now to FIG. 11, a cross-sectional view of the semiconductor structure 700 depicting the formation of the protective layer 1120 is shown, according to an embodiment of the present disclosure. As implied by its name, the protective layer 1120 protects pillar bumps 1240 (FIG. 12) during etching processes performed in subsequent manufacturing steps. Any suitable deposition technique can be implemented to form the protective layer 1120 within the openings 900. In an embodiment, CVD, PVD, or ALD processes can be used to form the protective layer 1120.

Any suitable directional etching process can be subsequently performed on the semiconductor structure 700 to remove portions of the protective layer 1120 parallel to the semiconductor substrate 102. As illustrated in the figure, portions of the protective layer 1120 perpendicular to the semiconductor substrate 102 remain along opposing sidewalls of the hardmask layer 810.

Exemplary materials than can be used to form the protective layer 1120 include tantalum nitride (TaN), titanium nitride (TiN) or tungsten nitride (WN). The protective layer 1120 may have a (horizontal) thickness varying from approximately 20 nm to approximately 500 nm and ranges there between, although a thickness less than 20 nm and greater than 500 nm may be acceptable.

Figure 12:
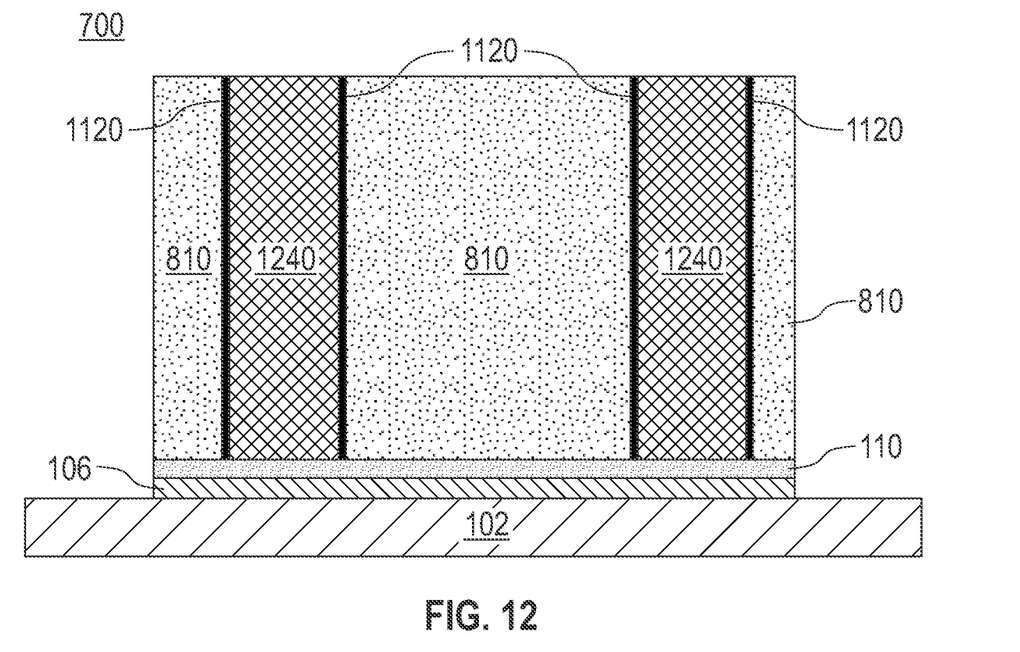
FIG. 12 is a cross-sectional view of the simplified semiconductor structure after filling the plurality of openings, according to another embodiment of the present disclosure.

Referring now to FIG. 12, a cross-sectional view of the semiconductor structure 700 after filling the openings 900 is shown, according to an embodiment of the present disclosure.

In this embodiment, the openings 900 are partially or fully filled with a conductive material with solder wettability to form the pillar bumps 1240. Preferably, the conductive material includes copper (Cu) or a copper alloy. The pillar bumps 1240 are formed using similar materials and techniques as the pillar bumps 420 described above with reference to FIG. 4. In this embodiment, the pillar bumps 1240 are covered laterally by the protective layer 1120, as illustrated in the figure.

Figure 13:
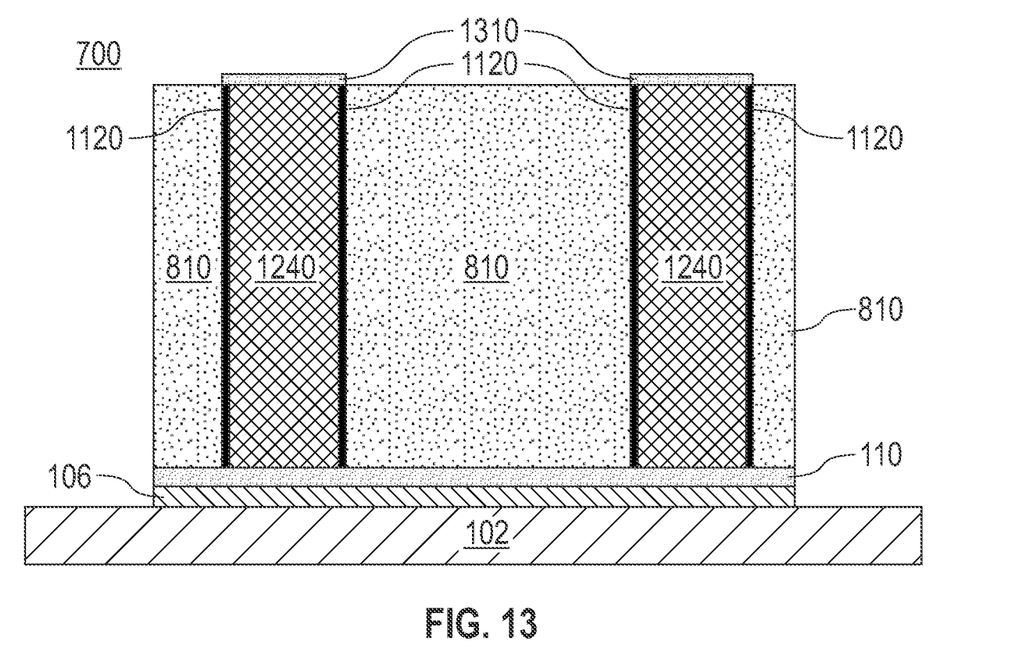
FIG. 13 is a cross-sectional view of the simplified semiconductor structure depicting the formation of a metal cap, according to another embodiment of the present disclosure.

Additionally or alternatively, a metal cap 1310 can be formed on top of the pillar bumps 1240, as depicted in FIG. 13. The metal cap 1310 can protect the pillar bumps 1240 during removal of the hardmask layer hardmask layer 810. The metal cap 1310 may be made of materials such as, for example, ruthenium, nickel, palladium, platinum, and alloys thereof and deposited using standard deposition techniques.

Figure 14:
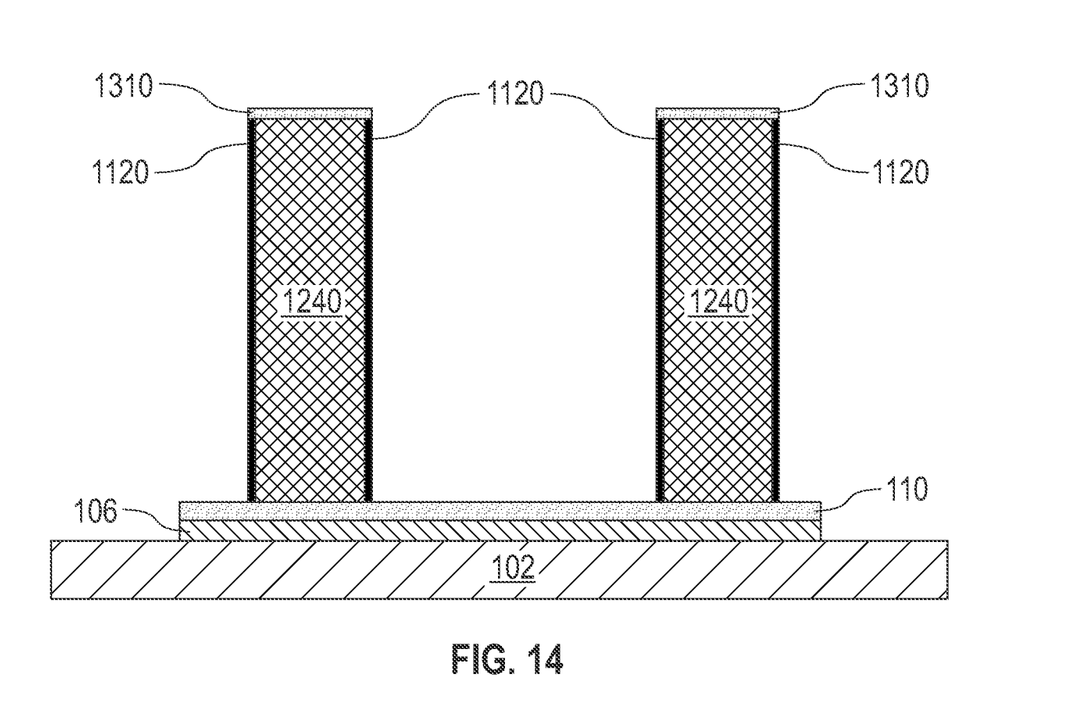
FIG. 14 is a cross-sectional view of the simplified semiconductor structure after removing the hardmask layer, according to another embodiment of the present disclosure.

Referring now to FIG. 14, a cross-sectional view of the semiconductor structure 700 is shown after removing the hardmask layer 810, according to an embodiment of the present disclosure. In this embodiment, any suitable etching process can be used to remove the hardmask layer 810. For example, a dry etch process (such as reactive ion etch) or wet etch processes.

Figure 15:
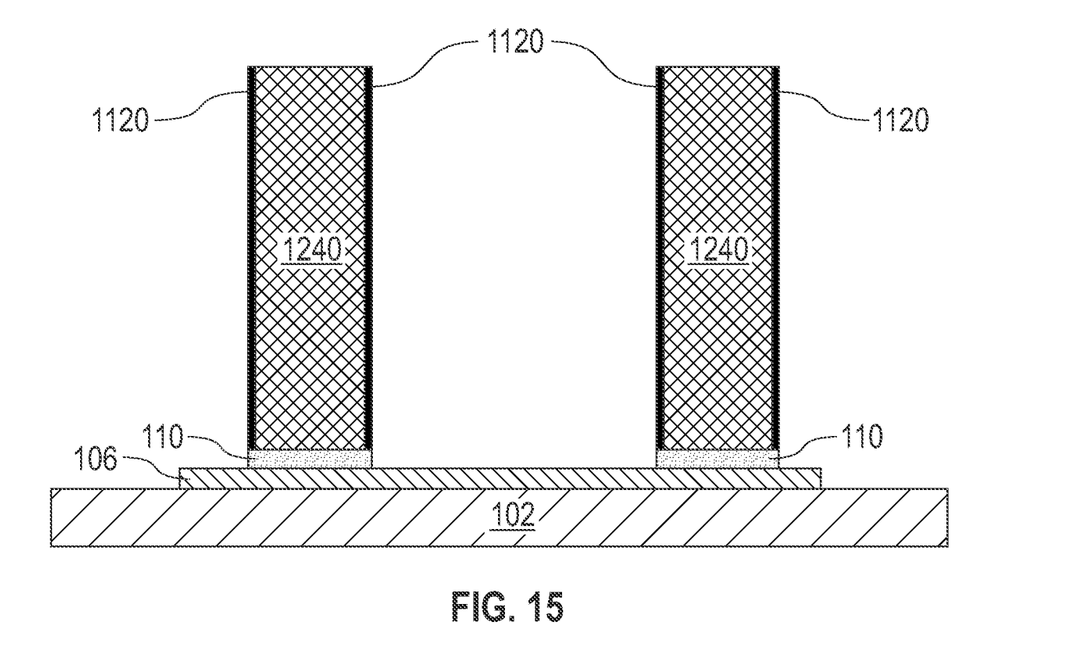
FIG. 15 is a cross-sectional view of the simplified semiconductor structure after removing the metal cap and uncovered portions of the seed layer from the semiconductor structure, according to another embodiment of the present disclosure.

Referring now to FIG. 15, a cross-sectional view of the semiconductor structure 700 is shown after removing the metal cap 1310 and uncovered portions of the seed layer 110, according to an embodiment of the present disclosure. In this embodiment, the metal cap 1310 and uncovered portions of the seed layer 110 can be removed by conducting a plasma dry etching technique. The metal cap and seed layer can be removed simultaneously in a single etch step or multiple etch steps.

As illustrated in the figure, in this embodiment a width of the seed layer 110 is equal to a width of the pillar bumps 1240 plus a width of the protective layer 1120 located along opposing sidewalls of the pillar bumps 1240.

It should be noted that the protective layer 1120 together with the remaining portions of the seed layer 110 protect the pillar bumps 1240 during removal of the hardmask layer 810 and during etching of portions of the seed layer 110 not covered by the pillar bumps 1240. As mentioned above by using a noble metal to form the seed layer 110, a dry etching technique can be implemented to remove the portions of the seed layer 110 not covered by the pillar bumps 1240. The dry etching technique is selective only to the noble metal seed layer 110, thereby allowing the removal of the uncovered portions of the metal seed layer 110 without undercut of the pillar bumps 1240 or loss of conductive material (i.e., copper).

Therefore, embodiments of the present disclosure provide pillar bumps with enhanced structural features. In an embodiment, the improved pillar bump structures are achieved by forming a noble metal seed layer that allows the use of dry etching techniques instead of the traditional wet chemical etching associated with copper loss and pedestal undercut. In another embodiment, a protective layer is formed along sidewalls of the pillar bumps to further protect the pillar bumps during hardmask removal and other manufacturing steps. The protective layer together with the noble metal seed layer may prevent copper loss from exposed pillars and pedestal undercut thereby enhancing device performance and reliability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming, on a semiconductor substrate, a blanket liner followed by a seed layer comprising a noble metal;
    forming a hardmask layer above the seed layer;
    forming a first photoresist layer directly above the hardmask layer;
    forming a first plurality of openings extending from the first photoresist layer through the hardmask layer to expose the seed layer;
    removing the first photoresist layer;
    forming a protective layer within the first plurality of openings;
    depositing a first conductive material within each of the first plurality of openings to form first pillar bumps, the protective layer being located along opposing sidewalls of each of the first pillar bumps;
    forming a metal cap above and in direct contact with a top surface of each of the first pillar bumps;
    removing the hardmask layer from the semiconductor structure; and
    removing portions of the seed layer extending outward from the first pillar bumps, wherein a portion of the seed layer remains underneath the first pillar bumps.

2. The method of claim 1, wherein the noble metal forming the seed layer comprises at least one of ruthenium, rhodium, iridium, platinum and palladium.

3. The method of claim 1, wherein removing the portions of the seed layer extending outward from the first pillar bumps comprises conducting a directional plasma dry etch process.

4. The method of claim 3, wherein the directional plasma dry etch process is selective only to the noble metal comprising the seed layer.

5. The method of claim 1, wherein forming the protective layer comprises:
    removing portions of the protective layer parallel to the semiconductor substrate such that portions of the protective layer perpendicular to the semiconductor substrate and in direct contact with the first pillar bumps remain in the semiconductor structure.

6. The method of claim 1, wherein the protective layer comprises tantalum nitride.

7. The method of claim 1, further comprising:
    removing the metal cap.

8. The method of claim 1, wherein the protective layer protects the first second pillar bumps during removal of the hardmask layer.

9. The method of claim 1, wherein a width of the portion of the seed layer underneath the first pillar bumps is equal to a width of the first pillar bumps plus a width of the protective layer.

10. A semiconductor structure, comprising:
    a pillar bump above a semiconductor substrate, the pillar bump comprising a conductive material;
    a protective layer along opposing sidewalls of the pillar bump; and
    a seed layer below the pillar bump and above the semiconductor substrate, the seed layer comprising a noble metal, wherein the width of the seed layer is equal to a width of the pillar bump plus a width of the protective layer along the opposing sidewalls of the pillar bump.

11. The semiconductor structure of claim 10, wherein the noble metal comprises at least one of ruthenium, rhodium, iridium, platinum and palladium.

12. The semiconductor structure of claim 10, wherein the protective layer comprises tantalum nitride.

* * * * *